United States Patent [19]

Schleicher et al.

[11] Patent Number: 4,821,706
[45] Date of Patent: Apr. 18, 1989

[54] HIGH VOLTAGE PULSE POWER DRIVE

[75] Inventors: Israel D. Schleicher, Costa Mesa; Robert H. Russell, Manhattan Beach, both of Calif.

[73] Assignee: North American Philips Corporation, New York, N.Y.

[21] Appl. No.: 108,522

[22] Filed: Oct. 15, 1987

[51] Int. Cl.⁴ .............................................. A61B 10/00
[52] U.S. Cl. ............................ 128/660.01; 310/317; 307/106; 307/270
[58] Field of Search .................. 128/660, 660.01; 307/264, 359, 106, 270; 330/269, 278, 300, 311; 310/317; 328/67, 108, 172, 65, 53; 318/66, 77, 341

[56] References Cited

U.S. PATENT DOCUMENTS

| | | | |
|---|---|---|---|
| 3,968,452 | 7/1976 | Sahara et al. | 307/264 X |
| 4,207,772 | 6/1980 | Stoller | 128/660 X |
| 4,550,606 | 11/1985 | Drost | 73/628 X |
| 4,644,198 | 2/1987 | Ahmed | 307/264 X |

*Primary Examiner*—Francis Jaworski
*Attorney, Agent, or Firm*—Jack E. Haken

[57] ABSTRACT

A high voltage power driven circuit for producing variable power pulses is responsive to a fixed low amplitude voltage input pulse train for determining the timing of the variable pulses, and to a variable control voltage power source for determining the power level of the pulse. In one embodiment the circuit is used in conjunction with associated circuits for transmitting an apodized and focussed beam of coherent ultrasound from an ultrasonic transducer array.

8 Claims, 4 Drawing Sheets

4,821,706

HIGH VOLTAGE PULSE POWER DRIVE

CROSS-REFERENCE TO RELATED APPLICATIONS

This application is related to two copending U.S. Patent applications filed simultaneously, one entitled "A Transmit Focus Generator for Ultrasound Imaging", R. H. Russell and L. D. Acker, inventors, Ser. No. 082,247, filed Aug. 5, 1987; and the other entitled "Apodization of Ultrasound Transmission", R. U. Russell, inventor, Ser. No. 082,248, filed Aug. 5, 1987; both assigned to the assignee of the present application and both incorporated herein by reference.

BACKGROUND OF THE INVENTION

1. Field of the Invention

This application pertains to the field of pulse power drivers, particularly for use in high voltage, high frequency applications. The invention is particularly useful for ultrasound medical imaging systems to provide a controlled amplitude, power burst to a piezoelectric transducer element.

2. Description of the Prior Art

A typical ultrasound imaging system used for medical imaging includes at least one ultrasound transducer, usually in the form of an array of transducer elements. The transducer is usually connected to transmitter stage circuitry, receiver stage circuitry and whatever devices may be necessary to effect mechanical scanning of the transducer. The transmitter stage comprises a generator of electrical excitation signals which are sent to the transducer. The transducer converts these signals into periodic pulse trains of ultrasound mechanical energy.

Transducer arrays used in medical imaging systems come in many forms, such as linear arrays, phased arrays, annular arrays and collimated image arrays. A transducer array usually consists of a plurality of transducer elements disposed on a surface in some designed arrangement such as a row, matrix or other geometric pattern. The individual elements or groups of elements are actuated or pulsed in sequence to transmit a beam of ultrasound energy at a field of interest. Ultrasound echoes are returned from the target and may be received on the same transducer elements. The pulse echo data received is then interpreted and displayed to produce an image.

A transducer may be apodized by shaping the distribution of energy applied across the transducer to a desired aperture function. For a single disc, piezoelectric transducer, this has been accomplished by shaping the applied electric field through use of different electrode geometries on opposite sides of the disc as described, for example, in Martin and Breazeale "A Simple Way to Eliminate Diffraction Lobes Emitted by Ultrasonic Transducers", J. Acoust. Soc. Am. 49 No. 5 (1971) 1668, 1669 or by applying different levels of electrical excitation to adjacent transducer elements in an array. However the method of Martin and Breazeale is limited to a number of simple fixed aperture functions and the use of separate surface electrodes requires complex transducer geometries and/or switching circuits.

Precise control of the potential fed to each transducer element of an array is essential for apodization in the transmit stage of a pulse echo imaging system. Ultrasound transmitters in present use are of the kind known as "voltage mode drivers". Typically an ultrasound transducer element is connected via a solid state switch to a fixed, high voltage supply. During transmission, the switch is closed for a short time, or in a repetitive manner, to produce a series of pulses across the transducer. The amplitude of these pulses is related to the voltage level of the supply and can only be controlled by changing the power supply potential. For an application that employs a linear array transducer of more than 100 elements, especially a shifting array, the precise control of this low impedance potential would necessitate a tremendous increase in complexity since each transducer element driver would require a separate controllable (voltage) supply.

The present invention describes a circuit which solves the problem of providing a variable voltage level to each transducer element in an array.

SUMMARY OF THE INVENTION

The invention is a high voltage pulse power driver that allows the use of a fixed high voltage power source to supply a variable power drive to piezoelectric transducer elements, such variable driver being controlled by a low potential control signal, the response time of which is effectively instantaneous. In this new driver circuit, the switching devices do not saturate, rather they drive a controlled amount of current into the transducer element. In addition to facilitating a simpler design, the new approach allows a much faster control of the pulse amplitude.

The circuit operates as a push-pull power driver. Until turned on by pulses on its inputs, the driver circuit draws no power. A variable potential, VPC, is applied to each of two active clamps. These clamps monitor the magnitude of the potential on the input lines relative to control potential, VPC.

When complementary bursts of clock pulses are applied to the two inputs of the driver, the potential at the base of each drive transistor rises toward that potential. When an input line reaches a potential equal to $VPC+V_{be}$, a clipping transistor circuit turns on and draws sufficient current to hold the drive potential at $VPC+V_{be}$. As a consequence, this is the level of drive potential applied to the base of the associated complementary output stage. The total current conducted by this output stage is set by the magnitude of the clipped drive signal and the magnitude of a resistor in the emitter circuit, which returns the total current to the circuit common. Thus, the amplitude of VPC controls the amplitude of the output current which flows through parallel current amplifying arrangements between the input stages and output stages and the load. This output current of the driver circuit is directly proportional to the VPC input potential. At the trailing edge of each pulse there is a fast return to the off condition.

The driver of the present invention operates in a non-saturating current mode in which the switching devices drive a controlled amount of power into the transducer element, allowing very fast control of pulse amplitude. In particular, the pulsed current driver enables shaping of the power across the full transmit aperture of many electrical transducers, thus controlling the beam width. The circuits all operate from a single fixed high voltage power supply to provide a profile of output power. The output is independent of variations in the high voltage power supply, thus achieving ripple-free output. These features are particularly useful for focusing and apodization at the transmit stage of a pulse echo imaging system.

DESCRIPTION OF THE PREFERRED EMBODIMENT

The invention is a high voltage pulse power driver that provides a controlled amplitude, power burst across a piezoelectric transducer element which is used in ultrasound imaging.

The present invention may be used with associated circuits for transmitting an apodized and focused beam of coherent ultrasound, utilizing an array of ultrasound transducers, accomplishing precisely timed delays and capable of coherent pulse trains over a wide range of burst lengths. A transducer array for pulse echo ultrasound imaging is apodized by causing the transmit output pulse magnitude to vary as a function of its position in the transmitting aperture. The desirability of apodization and the difficulty of achieving apodization with a shifting aperture are the reason for the present invention.

The invention will be described in the context of a system for ultrasound medical imaging, and specifically in terms of digitally controlling a linear array of transducer elements to transmit an apodized and focused wavefront of ultrasound energy. A transmit focus circuit and an apodization profiling circuit have been disclosed in the patent applications which have been incorporated herein by reference.

Figure 1:
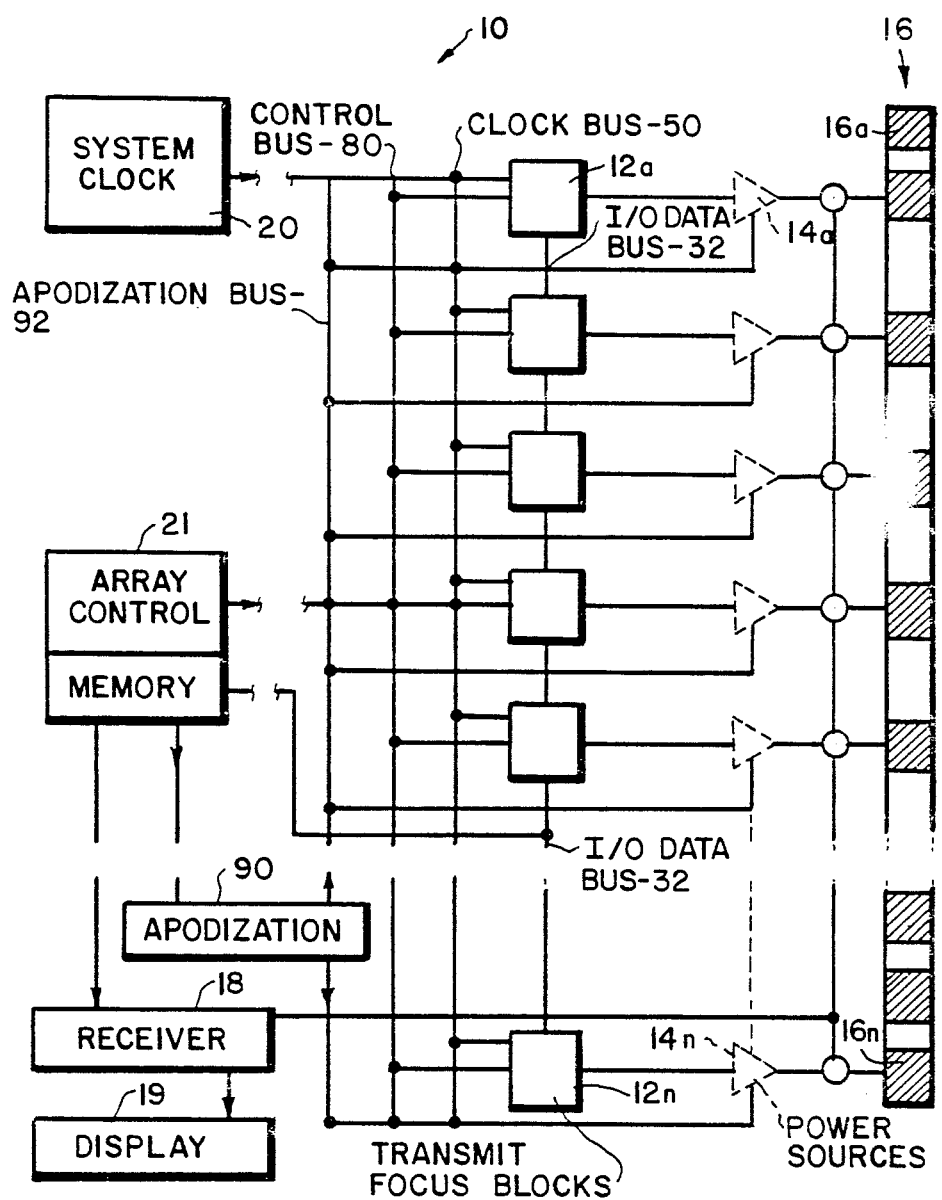
FIG. 1 is a simplified partial block diagram of the "front end" of a pulse echo ultrasound imaging system showing the interconnection of the subsystems relevant to the present invention.

Turning now to the drawings, FIG. 1 is a simplified block drawing of the "front end" 10 of an ultrasound medical imaging system which incorporates the present invention. In the system of the present invention, a linear transducer array 16, having N transducer elements 16a, . . . , 16n, is connected to both a transmit stage of the system having N power sources 14a, . . . , 14n; N transmit focus blocks 12a, . . . , 12n; and a receive stage 18 having a display system 19. In this particular system the parameters for the generation of each line scan are precalculated and stored in a system memory. The parameters for apodization are likewise precalculated and stored. Prior to the generation of each line scan, the type of line scan and the specific parameters for that scan are selected. The present invention is directed to a high voltage pulse power driver which provides a controlled amount of power to the drivers of the transducer elements. A variable current supplied to each element driver is directly proportional to a variable control voltage from an apodization profiling circuit in which selected parameters enable a subset of elements in an array 16 of N transducer elements to transmit an apodized focused beam of coherent ultrasound, thus generating a focused wavefront.

The invention may be used with an aperture profiling circuit such as that disclosed in referenced application Ser. No. 082,248 wherein, the transducer elements in an aperture each receive a calculated percentage, VPC, of a reference voltage VR, according to the profile of potential shown in FIG. 2 thereby. In the preferred embodiment of the present invention it is advantageous to use the transmit focus circuit disclosed in referenced application, Ser. No. 082,247, thus utilizing a digital circuit which controls focusing and apodization of the transmit stage.

Figure 2:
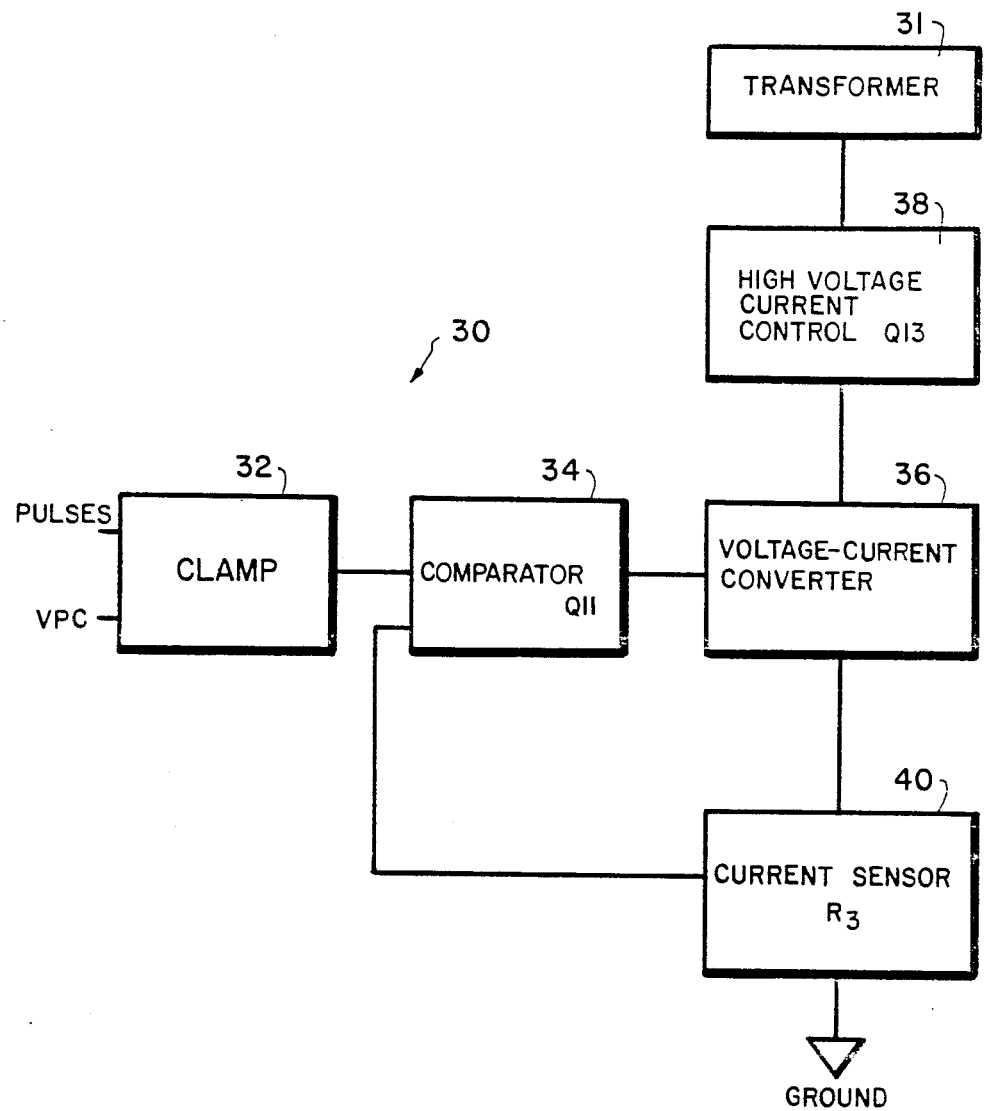
FIG. 2 is a block diagram of the driver circuit of the present invention.

FIG. 2 is an operational block diagram which illustrates the principle of the present invention. The driver 30 of the present invention uses a fixed high voltage power source to supply a variable power drive to piezoelectric transducer elements which is controlled by a low potential control signal. In FIG. 2, the high voltage power source is applied through a transformer 31. A control signal, VPC, is applied to an input clamp circuit 32. A the drive pulse train of fixed a is applied, to the PULSES input, it causes the clamp output potential to rise to the approximate amplitude of the control signal it is clipped above that level. The resulting low voltage is operatively connected through a comparator to a voltage-to-current converter 36 whose output serves to control a high voltage current control storage 38. The total current conducted by the control stage 38 is set by the magnitude of the applied signal and the magnitude of a resistor or current sensor 40 in the emitter circuit of the voltage-current converter 36. The amplitude of VPC, therefore, controls the amplitude of the output current to the transformer load 31.

Figure 3:
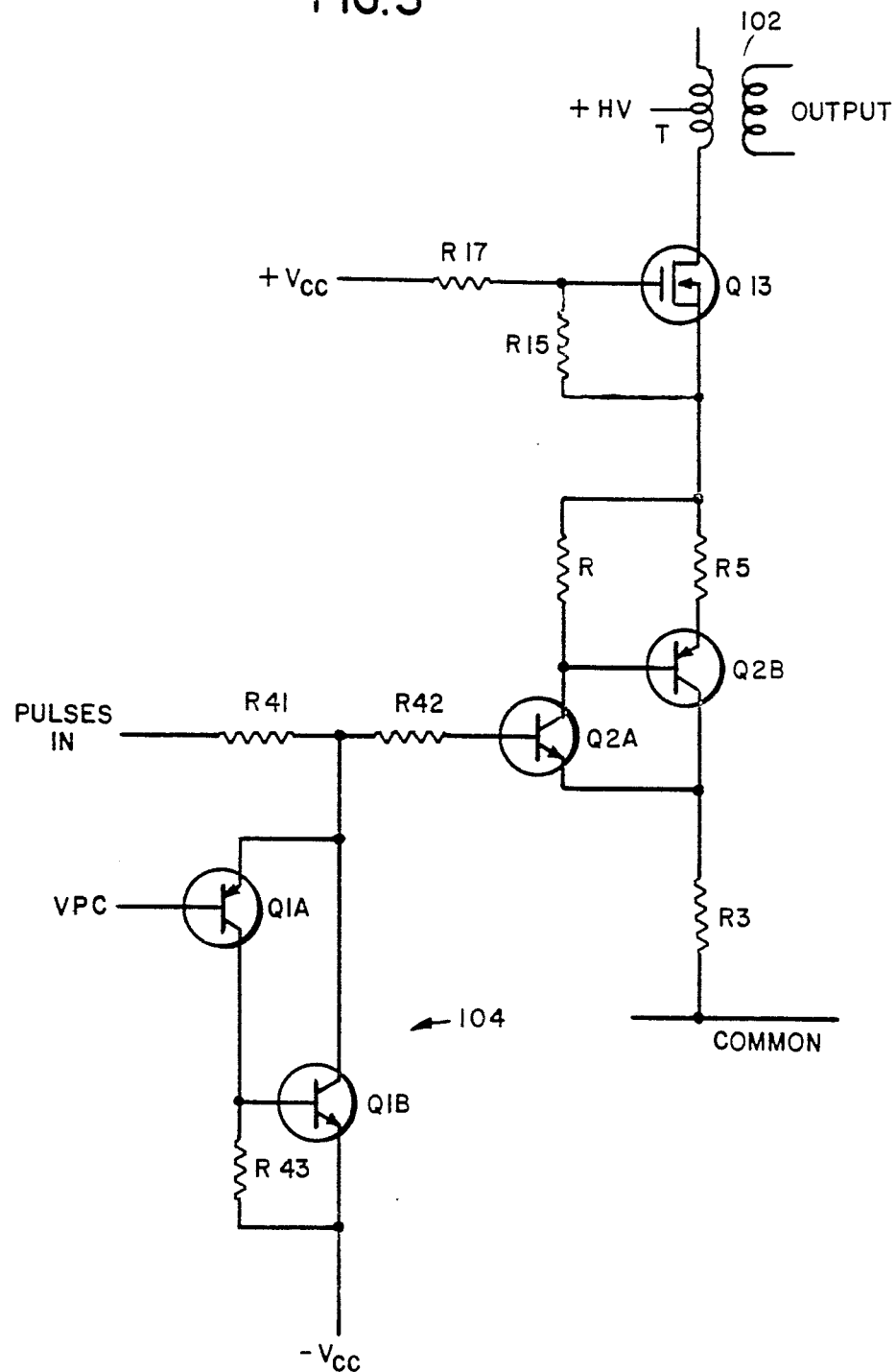
FIG. 3 is a simplified circuit diagram of a present embodiment of the high voltage pulse power driver of the invention.

FIG. 3 is a simplified circuit embodying the invention. In the circuit of FIG. 3, pulses are applied to the input of the driver. The potential at the base of the drive transistor Q2A rises toward the potential of the pulses. When the potential on the base reaches $VPC + V_{be}$, the clipping transistor circuit Q1A and Q1B turns on and draws sufficient current to hold the drive potential at VPC and $V_{be}$. As a consequence, this is the level of drive potential applied to the base of the output stage Q2A. Q3 serves as the high voltage current control. In FIG. 3, resistor R3 senses the total current conducted by the output stage. The output current is directly proportional to VPC. The constant of proportionality is set by the sense resistor R3.

The load represented by transformer T in FIG. 3 could be a resistor or a non-center-tapped transformer. The precise electrical embodiment of the load is not part of the invention. Transistor Q1 is compounded as Q1A and Q1B to reduce the loading of VPC. Q2 is compounded as Q2A and Q2B to reduce loading of the drive. Both are in complementary Darlington circuits. The stages are complementary to avoid summing base-emitter junctions. Q2B is created from four parallel transistors to limit the collector currents of each transistor to provide a reasonable current gain.

Figure 4:
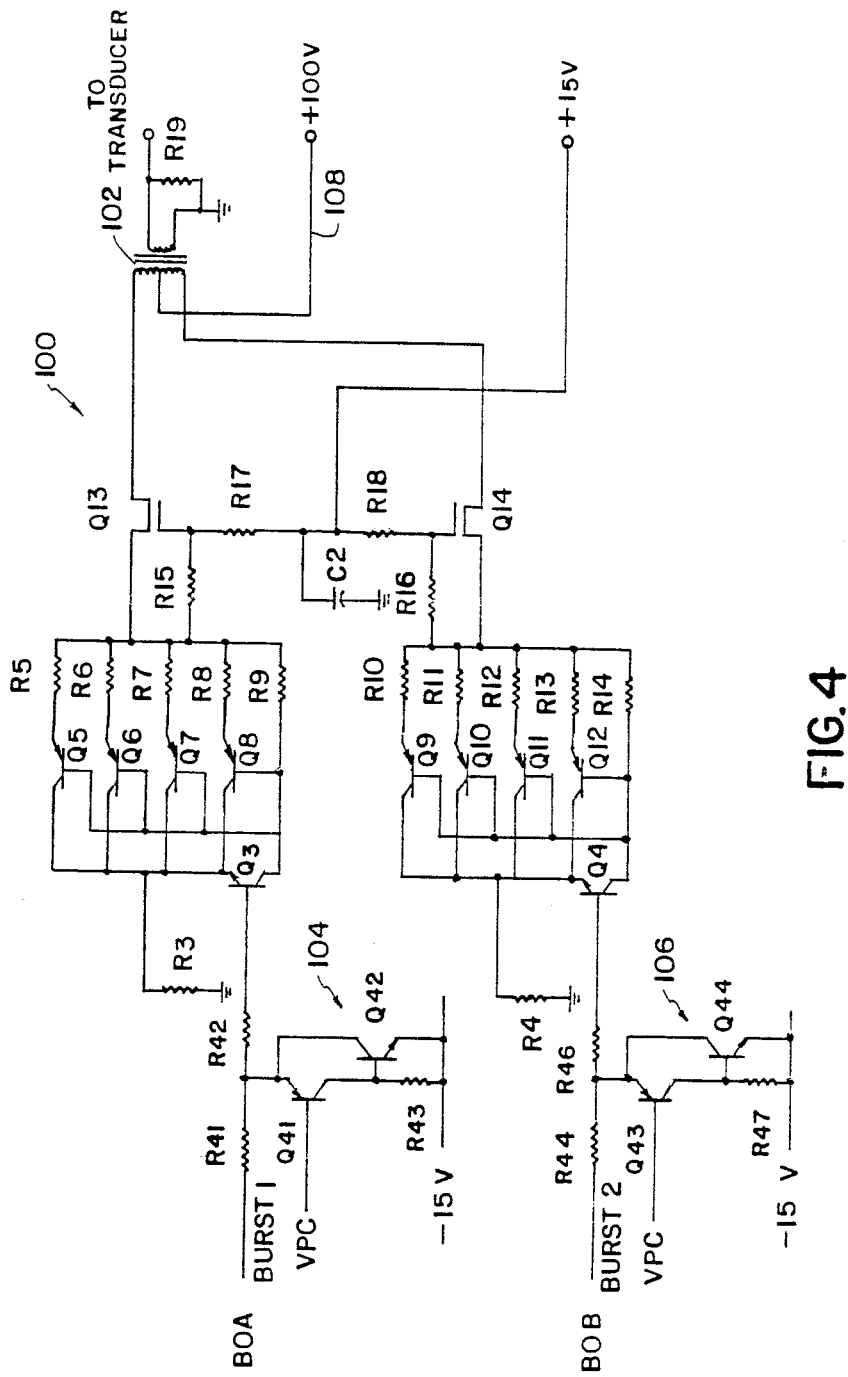
FIG. 4 is a detailed circuit diagram of the driver of FIG. 2.

FIG. 4 is a circuit diagram of a preferred embodiment of the high voltage pulse power driver 100 of the present invention. The circuit for driver 100 operates as a push-pull power driver using a center tapped transformer coupler 102. The purpose of driver circuit 100 is to use a fixed high voltage source to supply a variable power drive to piezoelectric transducer elements under the control of a low voltage control signal. The control signal VPC enables the circuit to change a pulsed voltage source to a pulsed current output such that the amplitude of the voltage pulses controls the amplitude of the current pulses. Since the driver is a push-pull driver, it requires two complementary bursts of pulses, one burst delayed by one-half cycle, and converts these bursts in parallel circuits. The inputs to driver circuit 100 are two complementary bursts of pulses, on input lines BOA and BOB, which are outputted from a clock pulse generator circuit, such as the transmit focus block disclosed in the first cross-referenced application, Ser. No. 082,247. When complementary bursts, burst 1 on line BOA and burst 2 on line BOB, of clock pulses of fixed amplitude are applied to the input of driver 100, the potential at the base of drive transistors Q3, Q4 rises to the amplitude of the control signal VPC. The control signal VPC is applied to the input clamps 104,106. When each line reaches a potential equal to VPC+$V_{be}$, the clipping transistor circuits 104, 106 turn on and draw sufficient current to hold the drive potential at VPC+$V_{be}$. As a consequence this is the level of drive potential applied to the base of the complementary output stage Q13, Q14. Thus, the drive potential remains at the level set by the variable power control output of the apodization circuit of the second cross-referenced application, Ser. No. 082,248. The amplitude of VPC varies from one driver circuit to another according to the profile of potential applied across the elements of a transducer array for a desired aperture function. A high voltage power supply 108 which is applied to the primary winding of transformer 102, allows the voltage to build up on resistors R3, R4 which are connected to ground, through current flowing in the circuit. The base-to-emitter current on Q3, Q4 then appears on their collectors. This current then turns on the cascade arrangements Q5 through Q8 and Q9 through Q12, which, in turn, turn on Q13 and Q14. The cascaded transistors Q5–Q8 and Q9–Q12 are current amplifiers which increase the current gain from the base of Q3, Q4 to the base of Q13, Q14. With Q13, Q14 alternatively turned on, current is drawn through transformer 102 from the high voltage of 100V and is controlled by Q13, Q14 stabilizing the voltage across R3, R4, which will adjust Q3, Q4 when the applied voltage is not balanced. The voltage across R3 or R4 equals the voltage at the bases of Q3 and Q4 minus the base-emitter drop, therefore VPC. The voltage across R3, R4 then sets the amount of current through transformer 102. As VPC varies, the controlled current will vary in proportion. Thus VPC sets the currents that flow through the current gain arrangements via Q13, Q14, transformer T1 and the load. Q13, Q14 are power amplifiers. The output current is controlled by VPC and it is given by $$Iload = \frac{VPC + V_{be} - V_{be}}{R3} \text{ or } \frac{VPC + V_{be} - V_{be}}{R4}, \simeq \frac{VPC}{R}$$

where $R3 = R4 = R$.

The resistors R17, R18 and capacitor C2 decouple Q13 from Q14 to prevent oscillation. R15, R16 are sized to prevent damage to Q13, Q14 in case leakage through Q13, Q14 is larger than the leakage through the current amplifiers, in which case the source potential may rise above the gate potential sufficiently enough to cause breakdown. T1 has high self-inductance and does not cause significant loss. R19 in parallel with the transducer element causes a fast return to base-line at the trailing edge of each pulse.

Alternative embodiments may be utilized. Q13, Q14 can be replaced by high voltage Darlingtons. The parallel combinations of Q5–Q8 and Q9–Q12 could be replaced by a single power rf transistor. The combination could also be replaced by a single channel power MOS transistor, in which case the upper frequency of operation might be compromised because of the high input capacitance of this device. Also a higher gate-to-bias ratio would be required for Q13, Q14. The winding ratios of T1 can be adapted to suit other load impedances.

Thus, the circuit of the present invention can provide a controlled amplitude, power burst across a low impedance transducer element. It achieves this in a non-saturating current mode operation in which the switching devices drive a controlled amount of power into the transducer element. This circuit permits a very fast control of pulse amplitude in a very simple design.

We claim:

1. A high voltage pulse power driver to provide controlled amplitude current pulses to a load comprising:
   a high voltage power source;
   a variable control voltage source;
   input means which receive a burst of constant amplitude voltage pulses;
   means which clamp the voltage of said burst of pulses at the voltage level of said control voltage source;
   current amplifying means which generate and amplify an electrical current which is proportional to the clamped voltage of said burst of pulses;
   driver means connected to said current amplifying means which control a current drawn from said high voltage power source through said load such that the amplitude of said low voltage power source controls the amplitude of the current from said high voltage source through the load.

2. A high voltage pulse power driver to provide controlled amplitude current pulses to a load comprising:
   a high voltage power source;
   a variable control voltage source;
   input means which receive a burst of constant amplitude voltage pulses;
   clamp means which clamp the voltage of said burst of pulses at the level of said variable voltage power source;
   a voltage to current converting transistor;
   said clamped voltage from said burst of pulses being fed to the base of said converting transistor;
   a current amplifying transistor connected in a Darlington arrangement to the emitter and collector of said converting transistor;
   an FET connected in series with said current amplifying transistor, the source and drain of said FET being connected in series with said high voltage source and said load;
   current sensor means connected in series with a current path of the converting transistor to stabilize the total current through said circuit;
   whereby the output from said driver is a pulsed current whose amplitude is proportional to the amplitude of said variable low power source.

3. A high voltage pulse power driver to supply a variable power drive to a load comprising:
   a high voltage power source;
   a input stage comprising:
   a variable control voltage source;
   means to receive incoming pulses having a constant amplitude voltage;
   means which clamp the voltage of said incoming pulses at the level of voltage of said control voltage source to produce a pulsed control voltage; and
   means which convert said pulsed control voltage to a pulsed control current, wherein the amplitude of said control current is directly proportional to the amplitude of said control voltage; and which feed said pulsed controlled current to an output stage; and an output stage comprising:

coupling means for coupling drawing said pulsed control current from said high voltage source through said load in response to switching states controlled by said control current; and means which limit the current from said high voltage source to said load.

4. A driver for producing variable power pulses in a low impedance load in response to a fixed amplitude voltage input pulse train which determines the timing of said variable power pulses and to a control voltage input which determines the power of said variable power pulses, comprising:

clamp circuit means which clamp the voltage of said input pulses to the voltage of said control voltage input;

voltage-to-current converter means connected to produce a current which is proportional to said clamped input pulse voltage;

a high voltage power source; and current control transistor means connected in series with a current output of said converter means, said power source, and said load.

5. An ultrasound transmitter which includes the driver of claim 4 and wherein the load is a piezoelectric transducer element.

6. The driver of claim 4 wherein the converter means is a Darlington transistor stage.

7. The driver of claim 4 wherein the Darlington transistor stage comprises an output having a plurality of parallel output transistors.

8. The driver of claim 6 wherein the control transistor means comprise:

a field effect transistor having a source-drain current path connected in series between said converter means and said load;

a first bias resistor connected from the gate of said field effect transistor to a fixed source of bias voltage; and a second bias resistor connected from said gate to the output of the Darlington stage, whereby the field effect transistor operates in an unsaturated mode.

* * * * *